US005530383A

United States Patent [19]
May

[11] Patent Number: 5,530,383
[45] Date of Patent: Jun. 25, 1996

[54] METHOD AND APPARATUS FOR A FREQUENCY DETECTION CIRCUIT FOR USE IN A PHASE LOCKED LOOP

[76] Inventor: Michael R. May, 13110 Rochester La., Austin, Tex. 78753

[21] Appl. No.: 349,586

[22] Filed: Dec. 5, 1994

[51] Int. Cl.⁶ .............................. H03L 7/097; H03D 3/24
[52] U.S. Cl. .................... 327/39; 327/43; 327/2; 327/18; 327/7; 327/20; 327/156; 327/147; 331/DIG. 2
[58] Field of Search .................... 327/39, 94, 43, 327/48, 49, 47, 33, 42, 159, 1, 2, 7, 20, 156, 147; 331/1 A, 27, DIG. 2

[56] References Cited

U.S. PATENT DOCUMENTS

| 4,128,811 | 12/1978 | Englund, Jr. ............... 327/40 |
| 4,267,514 | 5/1981 | Kimsey ............... 328/133 |
| 4,801,896 | 1/1989 | Phillips et al. ............... 331/25 |
| 5,126,690 | 6/1992 | Bui et al. ............... 331/DIG. 2 |
| 5,483,558 | 1/1996 | Leon et al. ............... 331/1 A |

*Primary Examiner*—Timothy P. Callahan
*Assistant Examiner*—Dinh T. Le

[57] ABSTRACT

A frequency lock indicator (10) comprises a first delay (14), second delay (20), first sampler (24), second sampler (28), third sampler (32), fourth sampler (34), and lock indicator (36). The first delay (14) delays a rising edge of a frequency reference (12) which clocks the first sampler (24) on a rising edge and the third sampler (32) on a falling edge. The second delay (20) delays a rising edge of a feedback signal (18) to produce a delayed feedback signal (22) which clocks the second sampler (28) on a rising edge and the fourth sampler (34) on a falling edge. The first and third samplers sample an up-pump signal (26) and the second and fourth samplers sample a down-pump signal (30). The lock indicator (36) produces a lock indication signal (38) when the sampled up-pump signal substantially equal to the sampled down-pump signal.

28 Claims, 6 Drawing Sheets

FIG. 1 -PRIOR ART- 5,530,383

METHOD AND APPARATUS FOR A FREQUENCY DETECTION CIRCUIT FOR USE IN A PHASE LOCKED LOOP

FIELD OF THE INVENTION

The present invention relates generally to frequency and phase locked loops and more particularly to circuitry and an associated method for sensing frequency lock and phase lock conditions.

BACKGROUND OF THE INVENTION

Integrated circuitry contained in computers, phones, pagers, and other electronic devices all require high frequency periodic clock signals in order to function. In specific applications, such as portable telephones, the high frequency clock signals must be in phase with a reference clock signal but at a much higher frequency. While frequency reference signals are provided in these applications, the high frequency clock signal must be constructed by the integrated circuitry. Therefore, circuitry has been developed to create high frequency clock signals in phase with, and at multiple frequencies of frequency references. Because frequency reference often have non-unity duty cycles, the high frequency clock signals typically are in phase with a rising edge of the frequency references but may not be in phase with reference to the falling edges of the frequency reference.

FIG. 1 illustrates a circuit commonly used to generate a high frequency clock signal called a phase-locked-loop ("PLL"). The major components of the PLL are a phase detector, a loop filter, a voltage controlled oscillator, and a divide by N element. As is shown, a frequency reference serves as an input to the PLL. The PLL output, in a steady state condition, oscillates at a frequency N times the frequency of the frequency reference and in phase with the rising edges of the frequency reference.

The divide by N circuit element divides the PLL output by N to provide a feedback signal that is compared with the frequency reference at the phase detector. The phase detector, in turn, provides two output signals to a loop filter based upon the relationship between the frequency reference and the feedback signal. A first output signal is called the up-pump. A second output signal is called the down-pump. The up-pump goes active high on a rising edge of the frequency reference while the down-pump signal goes active high on a rising edge of the feedback signal. If, however, one of the output signals is active high and the other output signal goes active high, both of the output signals go low.

Both the up-pump and down-pump are provided as inputs to the loop filter. The loop filter serves to filter out the high frequency components of the signals and to provide an output voltage that serves as an input to, and controls, the voltage controlled oscillator. The voltage controlled oscillator produces a periodic and symmetrical clock signal at a frequency dependent upon the voltage across its inputs.

During steady-state operation, an output of the PLL is at a desired frequency multiple (N times) of the frequency reference and in phase with the frequency reference such that one of the rising edges of the output coincides with each rising edge of the frequency reference. In steady-state, however, because the up-pump rises on a rising edge of the frequency reference and the down-pump signal rises on a rising edge of the feedback signal, one of the output signals rises a short period of time before the other output signal rises. Thus, even in steady-state, each of the output signals goes active high over a short period and then immediately falls. The loop filter serves to filter these transient, high frequency signals so that they do not vary the voltage controlling the voltage controlled oscillator. Therefore, the voltage across the voltage controlled oscillator inputs remains constant in steady-state operation, and resultantly, so does the PLL output.

When the frequency reference and the feedback signal are at different frequencies or the rising edges are not in phase, either the up-pump or down-pump signal remains active high for a longer period. Thus, the loop filter adjusts the voltage across the voltage controlled oscillator and the frequency of the output at the voltage controlled oscillator changes. The adjustments continue until such time as the frequency reference and the feedback signal are in phase and at the same frequency.

During power up, the PLL output rises in frequency until it reaches a steady-state. Over this time period, the PLL output is not available to drive connected circuitry. Without an indication of such, circuitry connected to the PLL may function based on the PLL output and produce erroneous results. Thus, it is desirable to known when the PLL reaches a frequency lock condition and also a phase lock condition. Further, it is desirable to know when the PLL moves away from its steady-state condition. Thus, frequency lock indicators have been devised to signal a frequency lock condition.

As is shown in a lower portion of FIG. 1, a particular prior art frequency lock indicator provide both the up-pump signal and down-pump signal as inputs to an OR gate. The output of the OR gate then serves to charge up a capacitor through a resistor. When the output of the OR gate provides a logic high signal to the capacitor over a sufficient period of time, the OR gate output charges the capacitor above a reference level. When the capacitor voltages reaches this reference level, a counter is reset. If the counter is reset before reaching some predetermined count value, the lock indicator is not set. If, however, the counter reaches the predetermined count value before the it is reset, the lock indicator is set.

The circuit shown in FIG. 1 worked well for high frequencies. At lower frequencies, however, such as those common in telecommunications applications, where 8 KHz is typical, the circuit was not operational. With an 8 KHz frequency reference signal, the amount of capacitance required in the circuit could not readily be provided on an integrated circuit. In addition, such circuits are dependent on the operating frequency.

Thus, a need exists for frequency lock and phase lock indicator circuitry that operates independent of the operating frequency, and for lower frequencies applications, operations without the need for a large capacitor.

DETAILED DESCRIPTION OF THE DRAWINGS

Generally, the present invention provides an apparatus and method for indicating frequency locked and phase locked conditions of a phase lock loop (PLL) circuit. This may be accomplished by sampling an up-pump signal and a down-pump signal at a rated of the frequency reference and feedback reference, respectively. As the sampled up-pump signals are being generated, they are compared with the sampled down-pump signals. If, during this comparison, the sampled up-pump signals substantially match the sampled down-pump signals, frequency lock has been obtained. Phase lock is obtained when the frequency lock has been continuously active for a predetermined period of time. With such a method and apparatus, a frequency and phase lock indication circuit can operate independent of the operating frequency of the PLL, and for lower frequencies applications, operations without the need for a large capacitor.

Figure 2:
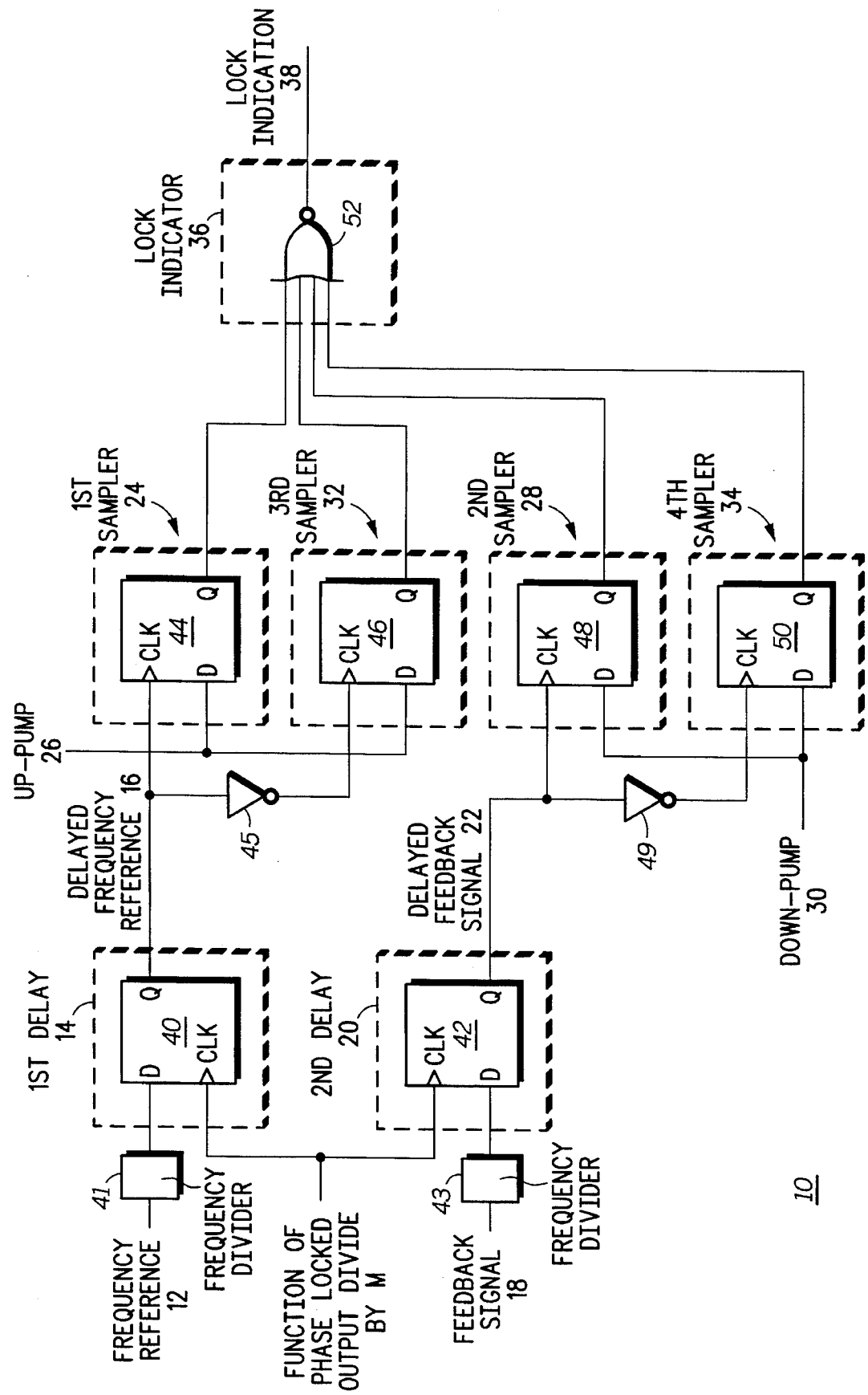
FIG. 2 illustrates a schematic block diagram of an embodiments of a frequency lock indicator in accordance with the present invention.

Referring to FIG. 2, a first embodiment of a frequency lock indicator, or frequency detection circuit, 10 of the present invention comprises a first delay 14, a first sampler 24, and a lock indicator 36. The present invention may also include a first frequency divider 41, a second frequency divider 43, a second sampler 28, a third sampler 32, and a fourth sampler 34 in other embodiments. As will be discussed, the frequency lock indicator 10 may be configured in a variety of ways to provide a lock indication signal 38. FIG. 2 shows an embodiment having frequency dividers 41 and 43 and four samplers. However, the first embodiment and other embodiments are discussed with reference to FIG. 2.

Figure 1:
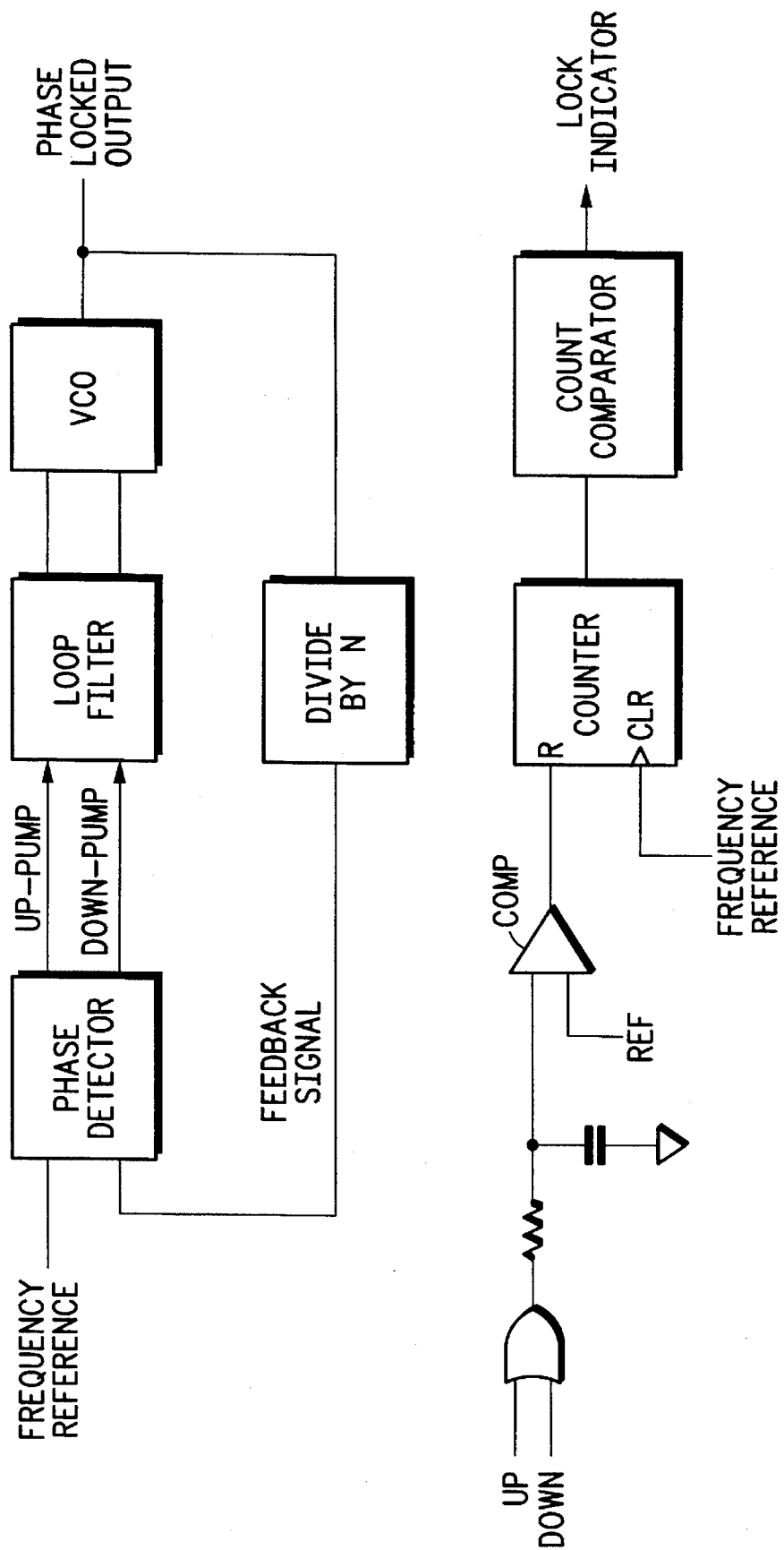
FIG. 1 illustrates a prior art phase-locked-loop circuit and associated frequency lock indicator.

The first delay 14 receives a periodic frequency reference 12 as its input. The same frequency reference 12 also serves as an input to the PLL (as shown in FIG. 1 ) with which the frequency lock indicator 10 operates. As has been discussed before, one application of the frequency lock indicator 10 is in the telecommunications area wherein a common frequency reference 12 oscillates 8 kilohertz. In a steady-state condition, an output of the PLL is in phase with the frequency reference 12 and oscillating at N times the frequency of the frequency reference 12. Further, as previously discussed, the PLL also has a feedback signal 18 produced by dividing the output of the PLL by N.

The first delay 14 preferably comprises a D-type flip flop 40 having the frequency reference 12 as its input and being clocked by a function of the PLL output. Preferably, the function of the PLL output is the output signal of the PLL divided by M where M is less than N. In a preferred mode of operation, N is selected as 1280 and M as 80. Thus, the first delay 14 is clocked 16 times during each cycle of the frequency reference 12.

Figure 4:
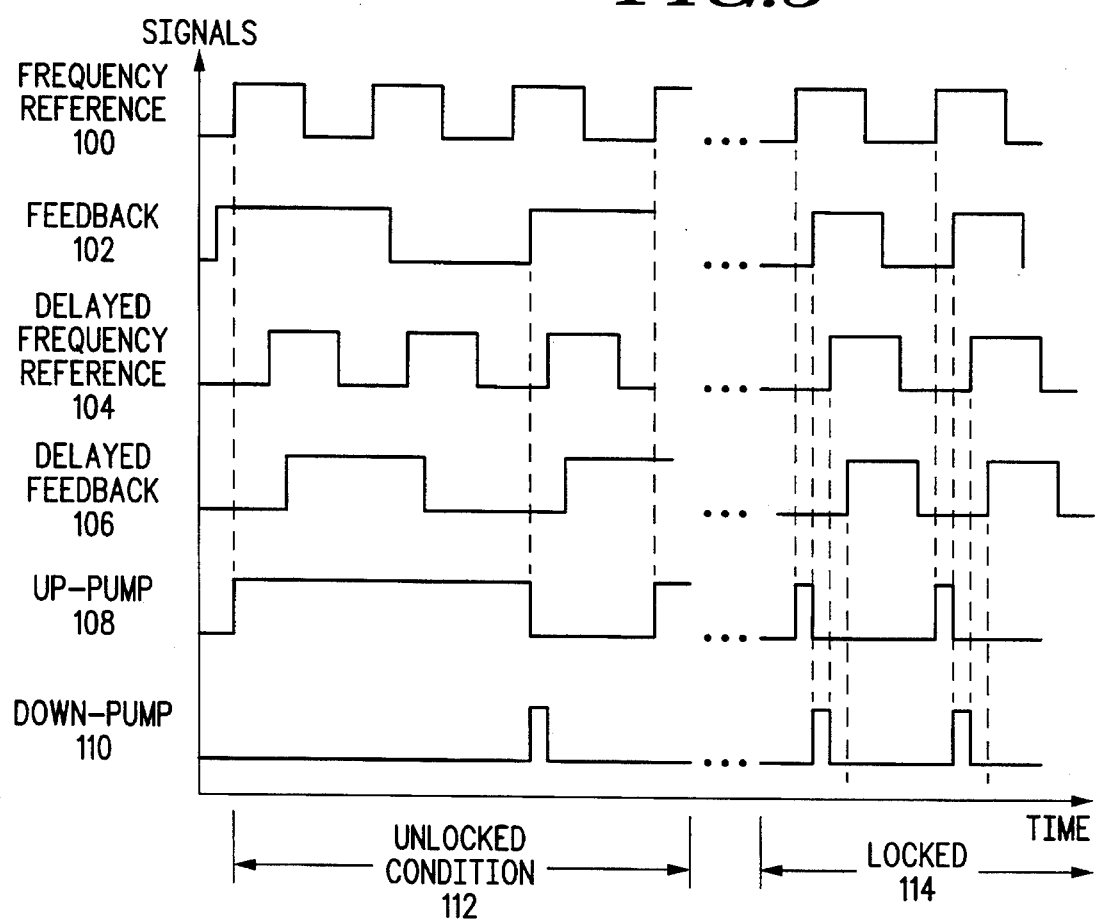
FIG. 4 illustrates a timing diagram of signals varying during the operation of the frequency lock indicator of FIG. 2.

The output of the first delay 14 produces a low to high transition the first time it is clocked after a low to high transition of the frequency reference 12. In operation, then, the output of the first delay 14 is a delayed frequency reference 16, the delay equal to the half period of the output of the PLL times M. Referring to FIG. 4, a delayed frequency reference 104 preferably looks identical to a frequency reference 100 but delayed in time.

Referring again to FIG. 2, the output of the first delay 14 serves as a clock to the first sampler 24. The first sampler 24 receives as its input the up-pump 26 from the PLL. Preferably, the first sampler 24 comprises a D-type flip flop having as its input the up-pump 26 from the PLL. Thus, with the first sampler 24 clocked by the delayed frequency reference 16, the output of the first sampler 24 is set logic high when the up-pump 26 is logic high at the time the first sampler 24 is clocked. Conversely, the output of the first sampler 24 is set logic low when the up-pump 26 is logic low at the time the first sampler 24 is clocked.

The first sampler 24 output serves as an input to the lock indicator 36. Preferably the lock indicator 36 comprises a NOR gate 52 with its output serving as a lock indication signal 38. When the NOR gate 52 has as its only input the output of the first sampler 24, it serves simply as an inverter. Thus, in the single input configuration of the first embodiment, the lock indication signal 38 goes active high when the output of the first sampler 24 goes active low.

In operation, then, a first embodiment of the frequency lock indicator 10 includes only a first delay 14, first sampler 24, and lock indicator 36 and provides a lock indication signal 38 when the output frequency of a connected PLL reaches or goes above a PLL lock frequency. However, when the output frequency of the PLL is below the PLL lock frequency, the PLL generates up-pumps longer than the delay, and the lock indicator 36 does not provide the lock indication signal 38. The first embodiment, however, provides an active lock indication signal 38 even when the PLL output goes above the desired frequency. Thus, the first embodiment provides a lock indication when the desired frequency is reached or exceeded.

A second embodiment of the frequency lock indicator 10 includes the first delay 14, the first sampler 24, and the lock indicator 36 and also a second delay 20 and a second sampler 28. The first delay 24 and first sampler 26 perform functions identical to those described above.

The second delay 20, preferably comprises a D-type flip flop 42 and is also clocked by the function of the PLL output that clocks the first delay 14. Thus, the second delay 20 produces a low to high transition the first time it is clocked after a low to high transition of the feedback signal 18. In operation, then, the output of the second delay 20 is a delayed feedback signal 18, the delay equal to the period of the output of the PLL times M. Referring to FIG. 4, a delayed feedback 106 preferably looks identical to a feedback 102 but delayed in time.

Referring again to FIG. 2, the output of the second delay 20 serves as a clock to the second sampler 28. The second sampler 28 receives as its input the down-pump 30 from the PLL. Preferably, the second sampler 28 comprises a D-type flip flop 48 having as its input the down-pump signal 30 from the PLL. Thus, with the second sampler 28 clocked by the delayed feedback signal 22, the output of the second sampler 28 is set logic high when the down-pump signal 26 is logic high at the time the second sampler 28 is clocked. Conversely, the output of the second sampler 28 is set logic low when the down-pump signal 30 is logic low at the time the second sampler 28 is clocked.

The second sampler 28 output also inputs to the lock indicator 36. Thus, in the second embodiment, the lock indication signal 38 is active high only when the outputs of both the first sampler 24 and second sampler 28 go active low. The second embodiment of the present invention provides an active lock indication signal 38 only when the PLL operates in a steady-state condition wherein up-pump 26 is logic low when the first sampler 24 is clocked and down-pump 30 is logic low when the second sampler 28 is clocked.

With reference to both FIG. 2 and FIG. 4, the operation of the second embodiment of the present invention is described. In an unlocked condition 112, the frequency reference 100 and feedback 102 are neither frequency locked nor phase locked. Thus, the up-pump 108 goes active high over a period of time before the down-pump signal 110 goes active high, driving both active low. The delayed frequency reference 104 clocks the first sampler 24 on its low to high transition. At that point, the up-pump 108 is active high and the output of the first sampler 24 is high. The delayed frequency reference 104 clocks the second sampler 28 on its low to high transition. At that point, the down-pump signal is low. Thus, the output of the second sampler 28 is low. But, because the output of the first sampler 24 is high, the lock indication signal 38 is low, signaling a "not locked" condition.

During a locked condition 114, the frequency reference 100 and the feedback 102 are frequency and phase locked, of the same frequency but delayed slightly with respect to one another. The up-pump 108 goes active high on a low to high transition of the frequency reference 100 while the down-pump signal 100 goes active high on a low to high transition of the feedback 102. In steady-state operation, the up-pump first 108 first goes active high, the down-pump signal 110 next goes high, and then both go low. When the delayed frequency reference 104 transitions from low to high, the up-pump 108 is already low. Further, when the delayed feedback signal 106 transitions from low to high, the down-pump signal 110 is already active low. Resultantly, the outputs of both the first sampler 24 and the second sampler 28 are low, i.e., they substantially match, and the lock indication signal 38 is active.

Referring again to FIG. 2, a third embodiment of the frequency lock indicator 10 of the present invention includes all of the elements of the first and second embodiments and also includes a third sampler 32 and a fourth sampler 34. When the frequency lock indicator 10 includes the third sampler 32 and the fourth sampler 34, the frequency lock indicator 10 also includes a first frequency divider 41 and a second frequency divider 43. The first frequency divider 41 creates a unity duty cycle output signal at one-half of the frequency of the frequency reference 12 by alternatively providing logic high and logic low signals at its output on low to high transitions of the frequency reference 12. Because many frequency reference signals are of a constant frequency only with respect to their low to high transition edge, the frequency reference 12 may transition from low to high, and back to low, before the first delay 14 is clocked by the function of the PLL output. Thus, the first frequency divider 41 guarantees that every other low to high transition of the frequency reference 12 will produce a delayed frequency reference 16 low to high transition as part of a clock having a 50% duty cycle.

Because the frequency reference 12 has been divided by two, the delayed frequency reference 16 transitions from low to high only on every other clock of the frequency reference 12. However, the delayed frequency reference 16 transitions from a high to low transition on alternating low to high transitions of the frequency reference 12. Therefore, the third sampler 32 is included to latch the value of up-pump on a high to low transition of the delayed frequency reference 16 as well. Inverter 45 provides an inverted delayed frequency reference 16 as a clock to the third sampler 32. Thus, when the up-pump is active high on an intermediary low to high transition of the frequency reference 12, the third sampler 32 latches up-pump to prevent a frequency lock indication signal 38.

The second frequency divider 43 divides the frequency of the feedback signal 18 by two as well so that the delayed feedback signal 22 remains consistent with the delayed frequency reference 16. Thus, the fourth sampler 34 is included to latch the value of down-pump on a high to low transition of the delayed frequency reference 16 as well. Inverter 49 provides an inverted delayed feedback signal 22 as a clock to the fourth sampler 34. Thus, when the down-pump 30 is active high on an intermediary low to high transition of the feedback signal 18, the fourth sampler 34 latches down-pump to prevent a frequency lock indication signal 38.

The outputs of all four samplers 24, 28, 32, and 34 serve as inputs to the NOR gate 52 associated with the lock indicator 36. Note that the first sampler 24 produces first up-pump samples (random high and low signals) when the frequency reference 12 and feedback signal 18 are not synchronized and produces second up-pump samples (all low signals) when the frequency reference 12 and feedback signal 18 are synchronized. Also note that the third samplers 32 produces inverse first up-pump samples (random high and low signals) when the frequency reference 12 and feedback signal 18 are not synchronized and produces inverse second up-pump samples (all low signals) when the frequency reference 12 and feedback signal 18 are synchronized. The second and fourth samplers 28, 43 produce similar signal samples for the sampled down-pump signal 30. Thus, only when the outputs of all four samplers 24, 28, 32, and 34 are logic low, i.e., they substantially match, will the lock indicator 36 provide the lock indication signal 38. By utilizing the samplers in this mode, a frequency and phase lock circuit does not need the capacitor of the prior art circuit, can produce reliable lock indications independent of the PLL operating frequency, and is readily implemented on an integrated circuit.

In operation, then, the third embodiment of the frequency lock indicator 10 of the present invention operates in a fashion similar to the second embodiment except for the division in frequency of the frequency reference 12 and the feedback signal 18. While the operation of the third embodiment produces a lock indication signal 38 signal only in accordance with the locked condition 114 as illustrated in FIG. 4, it provides the important benefit of removing duty cycle concerns relating to the frequency reference 12. Thus, the third embodiment of the frequency lock indicator 10 provides a more reliable lock indication signal 38 than does either the first embodiment or second embodiment.

As one skilled in the art will readily appreciate, other embodiments of the frequency lock indicator 10 of the present invention could include differing combinations of the first 24, second 28, third 32, and fourth 34 samplers as well as the first 14 and second 20 delays. The differing embodiments would provide benefits that could be applied to specific applications.

Figure 3:
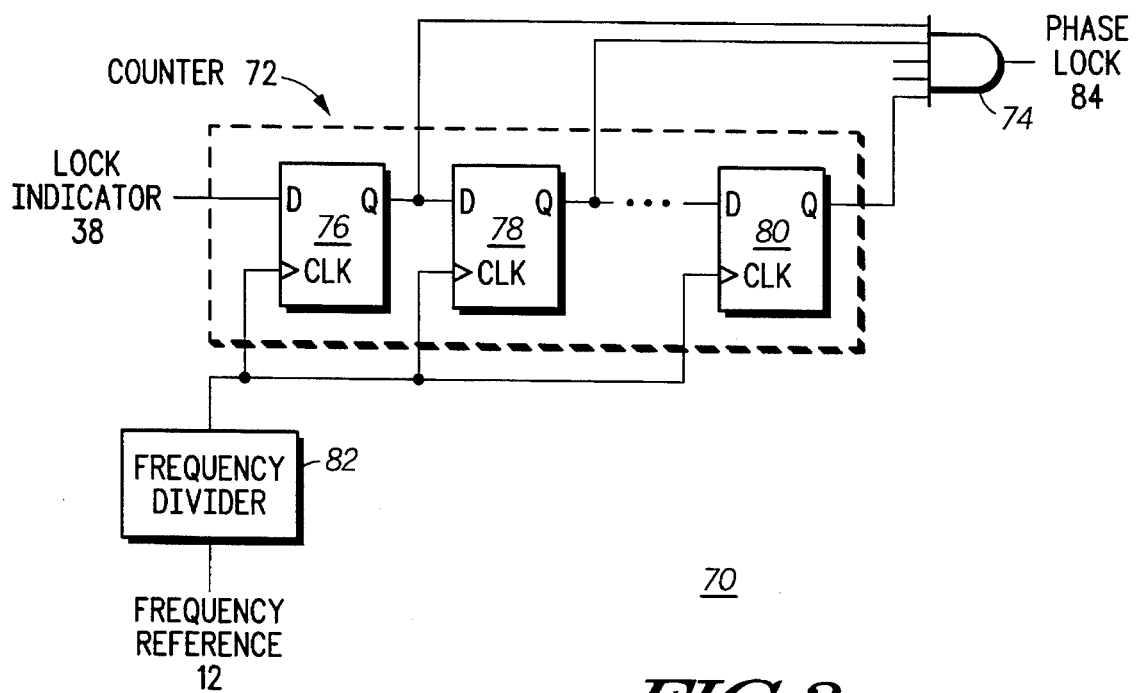
FIG. 3 illustrates a schematic block diagram of an embodiment of a phase lock indicator in accordance with the present invention.

FIG. 3 illustrates a preferred embodiment of a phase lock detector, or indicator, 70 of the present invention. The phase lock indicator 70 comprises a counter 72, an AND gate 74, and a frequency divider 82. The counter 72 preferably comprises N D-type flip flops (76, 78, ..., 80) cascaded such that the output of each previous flip flop serves as an input to the next successive flip flop. The lock indication signal 38 serves as an input to the first flip flop in cascade. The frequency reference 12 inputs to the frequency divider 82 which provides the clock signal to the N flip flops. Each of the N D-type flip flop outputs serves as an input to the AND gate 74. The output of the AND gate 74 provides a phase lock indication signal 84.

In operation, each of the D-type flip-flops (76, 78, . . . , 80) latches the value at its input when clocked. Because the D-type flip flops are cascaded, any logic low signal at the input to the first flip flop 76 will "propagate" through the counter 72 for N clock cycles. Further, the AND gate produces a phase lock indication signal 84 only when each D-type flip flop output (76, 78, . . . , 80) is logic high. Therefore, in order for a lock indication signal 84 to be produced, the frequency lock indication signal 38 must be logic high for N clocks of the counter 72. In a preferred embodiment, the frequency divider 82 divides the frequency reference 12 such that N clock periods provide a sufficient margin to guarantee a phase lock condition upon indication of the phase lock indication signal 84.

Figure 5:
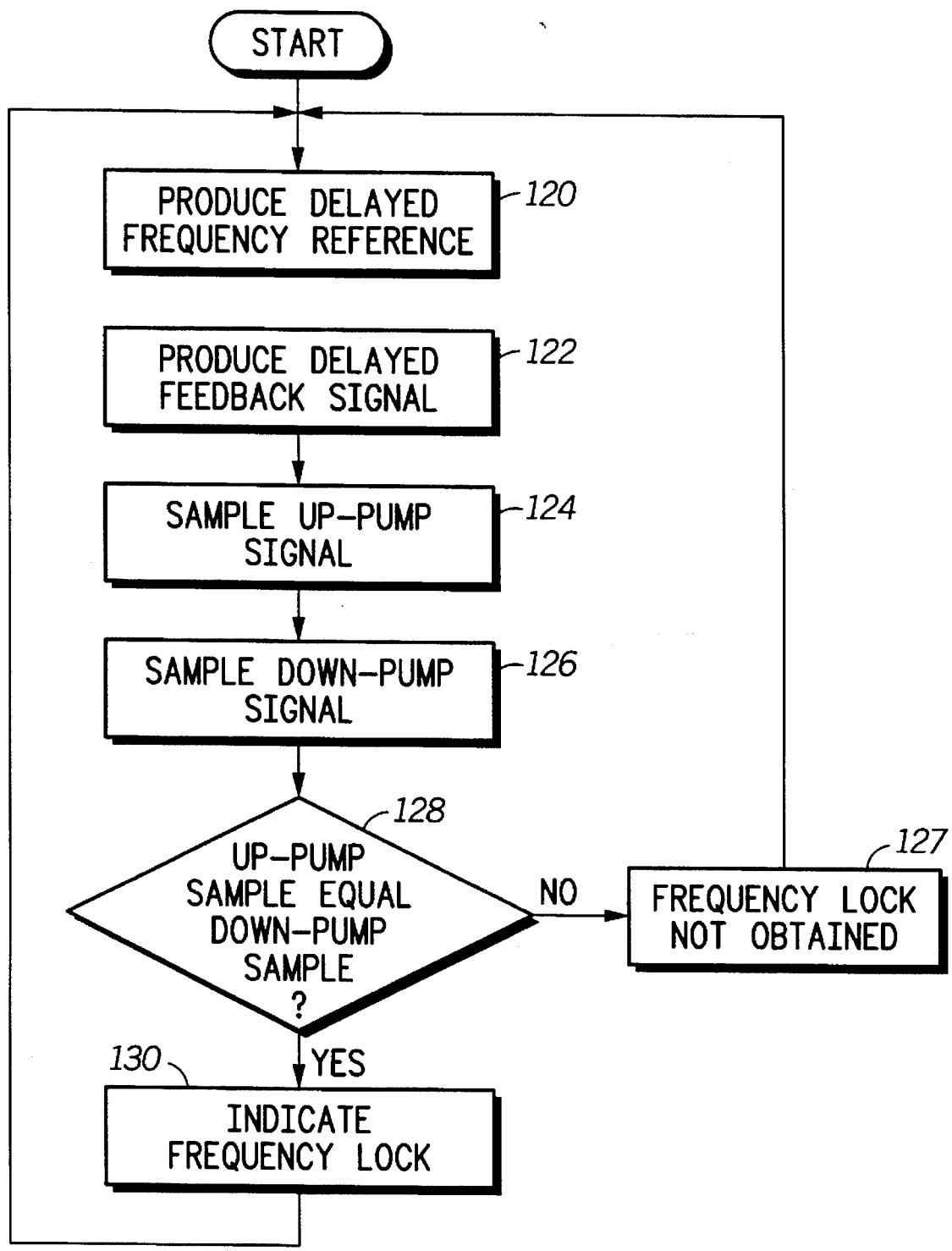
FIG. 5 illustrates a logic diagram detailing the steps of a method for producing a frequency lock indication in accordance with the present invention.

FIG. 5 illustrates a method of the present invention for producing a frequency lock indication. At step 120, a frequency reference 12 of the phase lock loop (PLL) is delayed by a predetermined delay to produce a delayed frequency reference 16. At step 122, a feedback reference, or signal, 18 of the PLL is delay by the predetermined delay to produce a delayed feedback signal 22. At step 124, an up-pump 26 of the PLL is sampled a rated of the delayed frequency reference 16. The up-pump signal 26 may be sampled on a first edge (e.g., rising edge) of the delayed frequency reference, a second edge (e.g., falling edge) of the delayed frequency reference, or on both the first and second edges. As the up-pump signal 26 is being sampled, first up-pump signal samples will be produced by sampling on the first edge and inverse first up-pump signal samples are produced by sampling on the second edge when the frequency reference and the feedback signal are not synchronized. These signal samples will transition low-to-high and high-to-low as the PLL attempts to reach a steady state condition. Once in the steady state condition, sampling the up-pump signal one the first and second edges produces second up-pump signal samples and inverse up-pump signal samples, which will be a continuous low level.

At step 126, a down-pump 30 of the PLL is sampled at a rate of the delayed feedback signal 22 on a first edge, a second edge, or both edges. As with the up-pump signal, first down-pump signal samples and inverse first down-pump signal samples are produced when the frequency reference and the feedback signal are not synchronized and second down-pump signal samples and inverse second down-pump signal samples are produced when the frequency reference and the feedback signal are synchronized. At decision step 128, the sampled up-pump signals are compared with the sampled down-pump signals. If the samples are not equal, i.e., the first up and down pump signal samples are being produced, step 129 is performed wherein frequency lock is not obtained or indicated and the method returns to step 120. If, at decision step 128, the samples are equal, i.e., the second up and down pump signal samples are being produced, the method goes to step 130 where frequency lock is indicated.

Figure 6:
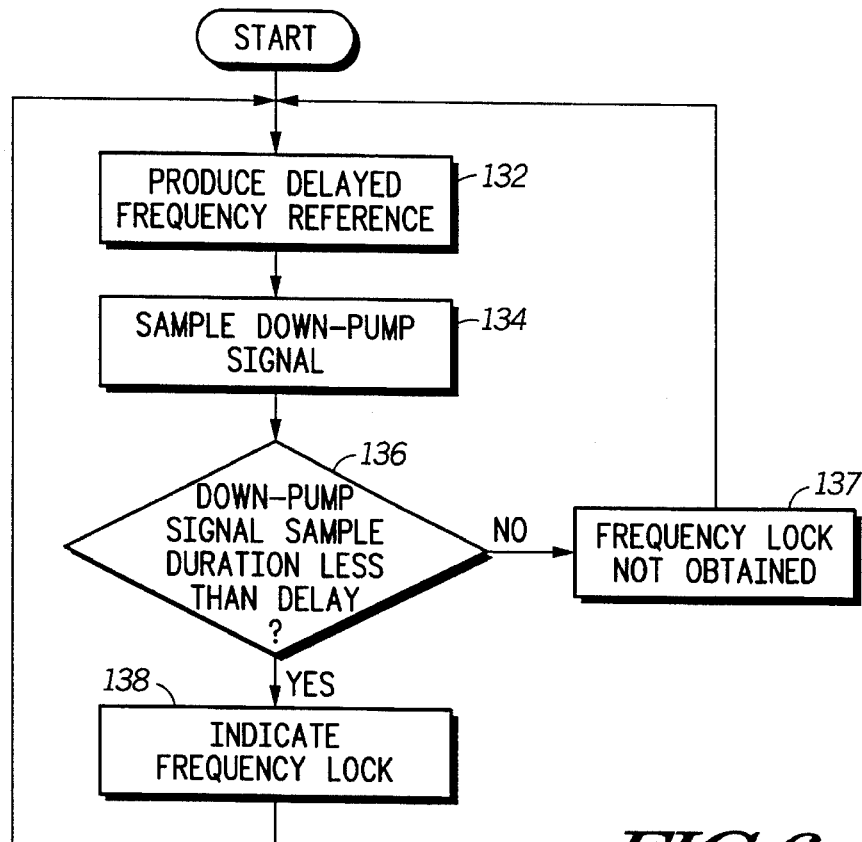
FIG. 6 illustrates a logic diagram detailing the steps of a method for producing a frequency lock indication in accordance with the present invention.

FIG. 6 illustrates a second method of the present invention for producing a frequency lock indication. At step 132, the method includes producing a delayed feedback signal 22 by delaying the feedback signal 18 by a predetermined delay. The predetermined delay may be set to any desired value, for example the predetermined delay may be the propagation delay of the first delay 14. At step 134, the down-pump 30 is sampled in a similar manner as was discussed above at step 126 of FIG. 5. At step 136, the duration of the down-pump sample is compared to the duration of the delay produced in step 132, i.e., the predetermined delay. If the duration of the down-pump signal sample is longer than the duration of the delay, step 137 is then executed wherein frequency lock is not obtained. After execution of step 137, the method returns to step 132. To illustrate this comparison refer to FIG. 4 which illustrates the feedback signal 102 and delayed feedback signal 106. As shown, when the down-pump signal is high on the rising edge of the delayed feedback signal, the PLL is in the unlocked condition 112.

Returning to the discussion of FIG. 6, if, however, the duration of the delay is longer than the duration of the down-pump sample, step 138 is then executed wherein frequency lock is indicated. After executing step 138, the method returns to step 132. To illustrate this step, again refer to FIG. 4 where, in the locked condition 114, the down-pump signal is low on the rising edge of the delayed feedback signal 106.

Figure 7:
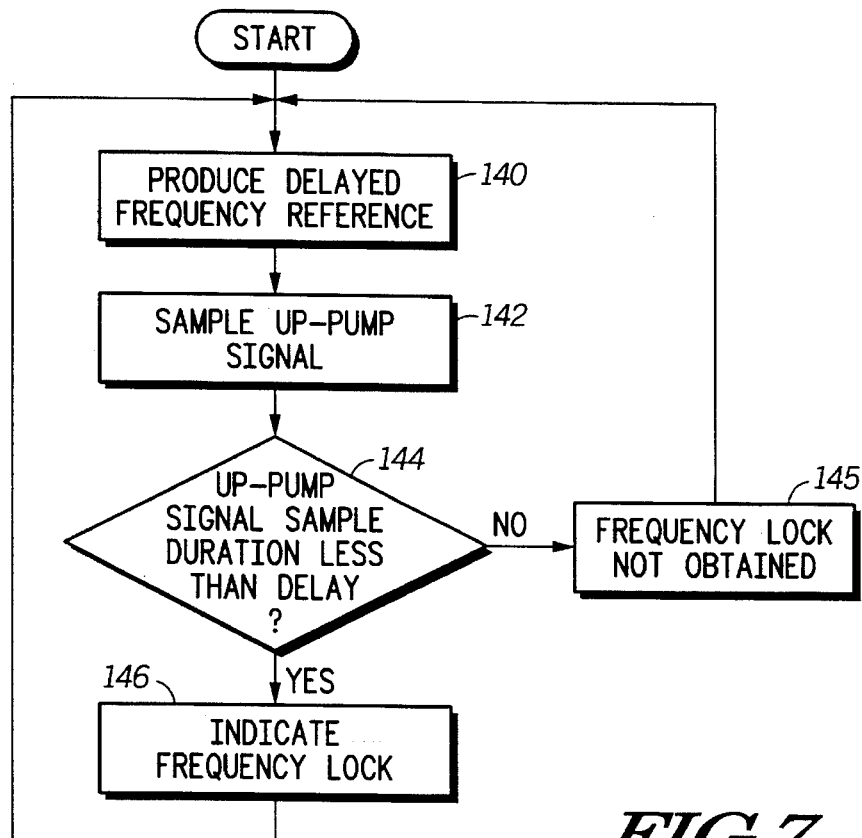
FIG. 7 illustrates a logic diagram detailing the steps of a method for producing a frequency lock indication in accordance with the present invention.

FIG. 7 illustrates another method of the present invention for producing a frequency lock indication. At step 140, the method includes producing a delayed frequency reference 16 by delaying the frequency reference by a predetermined delay. At step 142, the up-pump 26 is sampled as discussed in step 124 of FIG. 5. At decision step 144, the duration of the up-pump sample is compared to the duration of the delay produced in step 140. At decision step 144, if the duration of the up-pump sample is longer than the duration of the delay, step 145 is then executed wherein frequency lock is not obtained. After execution of step 145, the method returns to step 140. If, however, at decision step 136, the duration of the delay is longer than the duration of the up-pump sample, step 146 is then executed wherein frequency lock is indicated. After executing step 146, the method returns to step 140.

Figure 8:
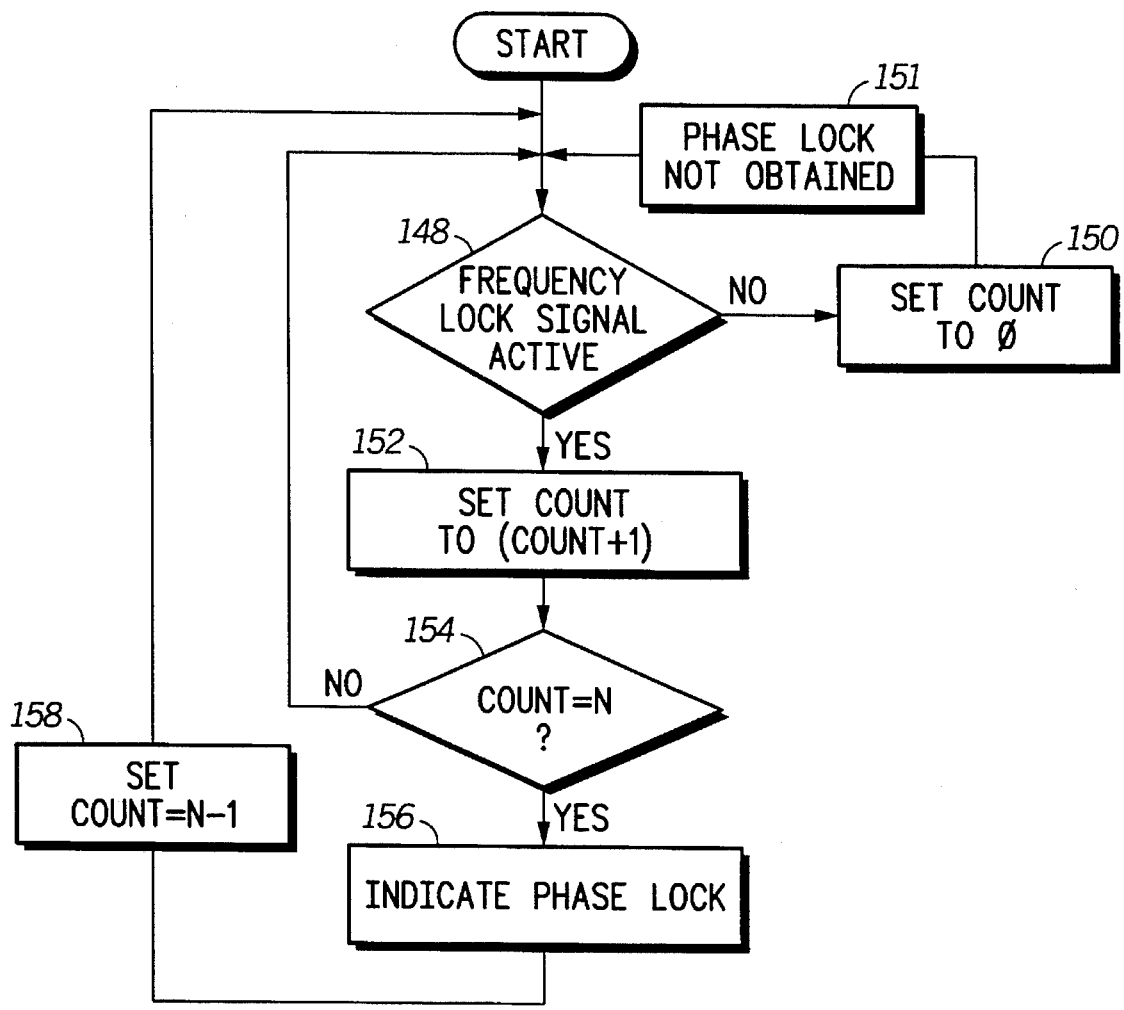
FIG. 8 illustrates a logic diagram detailing the steps of a method for producing a phase lock indication in accordance with the present invention.

FIG. 8 illustrates a method of the present invention for producing a phase lock indication. At decision step 148, it is determined whether the frequency lock indication 38 is active. If the frequency lock indication is not active, a counter 72 is set to zero at step 150, indicating at step 151 that phase lock has not been obtained. If, however, at decision step 148, the frequency lock indication is active, the method proceeds to step 152. At step 152, the counter 72 is incremented by one. The method then proceeds to decision step 154 wherein the newly incremented count value is compared to the value N. If the count value is not equal to N, the method returns to step 148. If, however, the count value is equal to N, the method indicates a phase lock at step 156, sets the count to (N-1) at step 158 and then returns to step 148. Thus, when the frequency lock indication signal 38 has been active high for the previous (N-1) clock cycles, and remains active the current clock cycle, the phase lock indication signal 84 is again produced.

The present invention provides an apparatus and method for indicating frequency locked and phase locked conditions of a phase lock loop (PLL) circuit. This may be accomplished by sampling an up-pump signal and a down-pump signal at a rate of the frequency reference and feedback reference, respectively. By sampling these signals in this manner, a frequency and phase lock indication circuit can operate independent of the operating frequency of the PLL, and for lower frequencies applications, operates without the need for a large capacitor.

The above described preferred embodiments are intended to illustrate the principles of the invention, but not to limit the scope of the invention. Various other embodiments and modifications to these preferred embodiments may be made by those skilled in the art without departing from the scope of the following claims.

I claim:

1. A frequency lock detection circuit for use in a phase locked loop, the frequency lock detection circuit comprising:
   (a) first delay that receives a frequency reference of the phase locked loop to produce a delayed frequency reference;
   (b) second delay that receives a feedback signal of the phase locked loop to produce a delayed feedback signal;
   (c) first sampler, coupled to the first delay, for receiving the delayed frequency reference, the first sampler samples an up pump signal of the phase locked loop at a rate of the delayed frequency reference to produce up pump signal samples;
   (d) second sampler, coupled to the second delay, for receiving the delayed feedback signal, the second sampler samples a down pump signal of the phase locked loop at a rate of the delayed feedback signal to produce down pump signal samples; and
   (e) frequency lock indicator, coupled to the first and second samplers, the frequency lock indicator produces a frequency lock indication signal when the up pump signal samples substantially match the down pump signal samples.

2. The frequency lock detection circuit of claim 1 further comprising:
   (a) a third sampler, coupled between the first delay and said frequency look indicator, that samples the up pump signal at the rate of the delayed frequency reference to produce additional up pump signal samples; and
   (b) wherein the first sampler samples the up pump signal on a first edge of the delayed frequency reference and the third sampler samples the up pump signal on a second edge of the delayed frequency reference.

3. The frequency lock detection circuit of claim 2 further comprising:
   (a) a fourth sampler, coupled between the second delay and said frequency lock indicator, that samples the down pump signal at the rate of the delayed feedback signal to produce additional down pump signal samples; and
   (b) wherein the second sampler samples the down pump signal on a first edge of the delayed feedback signal and the fourth sampler samples the up pump signal on a second edge of the delayed feedback signal.

4. The frequency lock detection circuit of claim 1 wherein the first and second delays each comprise a flip-flop clocked by a function of an output of a phase locked loop.

5. The frequency lock detection circuit of claim 1 further comprising a phase lock indicator coupled to said frequency lock indicator that provides a phase lock indication signal when the frequency lock indication signal has been produced for a predetermined period of time.

6. The frequency lock detection circuit of claim 5, wherein the phase lock indicator comprises a counter and a counter output, wherein the counter receives the frequency lock indication signal as an input and is clocked by a representation of the frequency reference and wherein the counter output provides the phase lock indication signal when the counter has been clocked for a predetermined number of clock cycles with the frequency lock indication signal activated.

7. The frequency lock detection circuit of claim 6 wherein the counter comprises a plurality of cascaded flip-flops, each flip-flop having an output provided as an input to the counter output which includes an AND gate, an output of the AND gate producing the phase lock indication signal.

8. The frequency lock detection circuit of claim 7 wherein at least one of the plurality of flip-flops resets when the frequency lock indication signal goes inactive.

9. A frequency lock detection circuit for use in a phase locked loop, the frequency lock detection circuit comprising:
   (a) delay element that delays, by a predetermined delay, a frequency reference of the phase locked loop to produce a delayed frequency reference;
   (b) sampler, coupled to the delay element, that samples, at a rate of the delayed frequency reference and on a first edge of the delayed frequency reference, an up pump signal of the phase locked loop to produce first up pump signal samples when duration of the up pump signal is greater than duration of the predetermined delay and produces second up pump signal samples when the duration of the up pump signal is less than the duration of the predetermined delay; and
   (c) lock indicator, coupled to the sampler, that produces a frequency lock indication signal when the sampler produces the second up pump signal samples.

10. The frequency lock detection circuit of claim 9 further comprising:
    (a) a second sampler, coupled between delay element and said lock indicator, that samples, on a second edge of the delayed frequency reference, the up pump signal of the phase locked loop to produce inverse first up pump signal samples when the duration of the up pump signal is greater than the duration of the predetermined delay and produces inverse second up pump signal samples when the duration of the up pump signal is less than the duration of the predetermined delay; and
    (b) wherein the lock indicator produces the frequency lock indication signal when the second sampler produces the inverse second up pump signal samples.

11. The frequency lock detection circuit of claim 10 wherein the delay element comprises at least one flip-flop clocked by a function of an output of a phase locked loop.

12. The frequency lock detection circuit of claim 10 further comprising a phase lock indicator coupled to said lock indicator that provides a phase lock indication signal when the frequency lock indication signal has been produced for a predetermined period of time.

13. The frequency lock detection circuit of claim 12, wherein the phase lock indicator comprises a counter and a counter output, wherein the counter receives the frequency lock indication signal as an input and is clocked by a representation of the frequency reference and wherein the counter output provides the phase lock indication signal when the counter has been clocked for a predetermined number of clock cycles with the frequency lock indication signal activated.

14. The frequency lock detection circuit of claim 13 wherein the counter comprises a plurality of cascaded flip-flops, each flip-flop having an output provided as an input to the counter output which includes an AND gate, an output of the AND gate producing the phase lock indication signal.

15. The frequency lock detection circuit of claim 14 wherein at least one of the flip-flops resets when the frequency lock indication signal goes inactive.

16. A frequency lock detection circuit for use in a phase locked loop, the frequency lock detection circuit comprising:

(a) delay element that delays by a predetermined delay a feedback reference of the phase locked loop to produce a delayed feedback signal;

(b) sampler, coupled to the delay element, that samples, at a rate of the delayed feedback signal and on a first edge of the delayed feedback signal, a down pump signal of the phase locked loop to produce first down pump signal samples when duration of the down pump signal is greater than duration of the predetermined delay and produces second down pump signal samples when the duration of the down pump signal is less than the duration of the predetermined delay; and (c) lock indicator, coupled to the sampler, that produces a frequency lock indication signal when the sampler produces the second down pump signal samples.

17. The frequency lock detection circuit of claim 16 further comprising:

(a) a second sampler, coupled between the delay element and said lock indicator, that samples, on a second edge of the delayed feedback signal, the down pump signal of the phase locked loop to produce inverse first down pump signal samples when duration of the down pump signal is greater than duration of the predetermined delay and produces inverse second down pump signal samples when the duration of the down pump signal is less than the duration of the predetermined delay; and (b) wherein the lock indicator produces a frequency lock indication signal when the second sampler produces the inverse second down pump signal samples.

18. The frequency lock detection circuit of claim 16 wherein the delay element comprises at least one flip-flop clocked by a function of an output of a phase locked loop.

19. The frequency lock detection circuit of claim 16 further comprising a phase lock indicator coupled to said lock indicator that provides a phase lock indication signal when the frequency lock indication signal has been produced for a predetermined period of time.

20. The frequency lock detection circuit of claim 19, wherein the phase lock indicator comprises a counter and a counter output, wherein the counter receives the frequency lock indication signal as an input and is clocked by a representation of a frequency reference and wherein the counter output provides the phase lock indication signal when the counter has been clocked for a predetermined number of clock cycles with the frequency lock indication signal activated.

21. The frequency lock detection circuit of claim 20, wherein the counter comprises a plurality of cascaded flip-flops, each flip-flop having an output provided as an input to the counter output which includes an AND gate, an output of the AND gate producing the phase lock indication signal.

22. The frequency lock detection circuit of claim 21 wherein at least one of the flip-flops resets when the frequency lock indication signal goes inactive.

23. A method for detecting a frequency lock condition of a phase locked loop circuit, the method comprising the steps of:

(a) delaying by a first delay a frequency reference of the phase locked loop to produce a delayed frequency reference;

(b) delaying by a second delay a feedback signal of the phase locked loop to produce a delayed feedback signal;

(c) sampling an up pump signal of the phase locked loop at a rate of the delayed frequency reference to produce up pump signal samples;

(d) sampling a down pump signal of the phase locked loop at a rate of the delayed feedback signal to produce down pump signal samples; and (e) indicating a frequency lock condition when the up pump signal samples substantially match the down pump signal samples.

24. The method of claim 23 further comprising the step of:

(a) providing a phase lock indication signal when the frequency lock condition has been produced for a predetermined period of time.

25. A method for detecting a frequency lock condition of a phase locked loop circuit, the method comprising the steps of:

(a) delaying by a predetermined delay a frequency reference of the phase locked loop to produce a delayed frequency reference;

(b) sampling an up pump signal of the phase locked loop circuit at a rate of the delayed frequency reference to produce first up pump signal samples when duration of the up pump signal is greater than duration of the predetermined delay and produces second up pump signal samples when the duration of the up pump signal is less than the duration of the predetermined delay; and (c) producing a frequency lock indication signal when the second up pump signal samples are produced.

26. The method of claim 25 further comprising the step of:

(a) providing a phase lock indication signal when the frequency lock indication signal has been produced for a predetermined period of time.

27. A method for detecting a frequency lock condition of a phase locked loop circuit, the method comprising the steps of:

(a) delaying by a predetermined delay a feedback signal of the phase locked loop to produce a delayed feedback signal;

(b) sampling a down pump signal of the phase locked loop circuit at a rate of the delayed feedback signal to produce first down pump signal samples when duration of the down pump signal is greater than duration of the predetermined delay and produces second down pump signal samples when the duration of the down pump signal is less than the duration of the predetermined delay; and (c) producing a frequency lock indication signal when the sampler produces the second down pump signal samples.

28. The method of claim 27 further comprising the step of:

(a) providing a phase lock indication signal when the frequency lock indication signal has been produced for a predetermined period of time.

* * * * *